United States Patent [19]

Solo de Zaldivar

[11] 4,332,076
[45] Jun. 1, 1982

[54] METHOD OF MANUFACTURING A SEMICONDUCTOR DEVICE

[75] Inventor: Jose Solo de Zaldivar, Wädenswill, Switzerland

[73] Assignee: U.S. Philips Corporation, New York, N.Y.

[21] Appl. No.: 178,644

[22] Filed: Aug. 15, 1980

Related U.S. Application Data

[63] Continuation of Ser. No. 943,234, Sep. 18, 1978, abandoned.

[30] Foreign Application Priority Data

Sep. 29, 1977 [NL] Netherlands .................. 7710635

[51] Int. Cl.$^3$ ........................................ H01L 21/225
[52] U.S. Cl. ................................ 29/571; 29/576 B; 148/187; 148/188; 357/59; 357/91
[58] Field of Search .............. 29/571, 576 B; 148/1.5, 148/187, 188; 357/59, 91

[56] References Cited

U.S. PATENT DOCUMENTS

| | | | |
|---|---|---|---|
| 3,540,925 | 11/1970 | Athanas et al. ............... | 148/1.5 X |
| 3,704,178 | 11/1972 | Hill ................................ | 148/1.5 |
| 3,775,191 | 11/1973 | McQuhae ..................... | 148/1.5 |
| 4,062,699 | 12/1977 | Armstrong .................... | 148/187 X |
| 4,063,967 | 12/1977 | Graul et al. ................... | 148/188 X |
| 4,151,007 | 4/1979 | Levinstein et al. ........... | 148/1.5 |

OTHER PUBLICATIONS

Ghezzo et al., *J. Electrochem. Soc.: Solid-State Science and Technology*, vol. 120, No. 1, Jan. 1973, pp. 146-148.
Hofstein, *Solid-State Electronics*, Pergamon Press, G.B., vol. 10, pp. 657-670, 1967.

*Primary Examiner*—G. Ozaki
*Attorney, Agent, or Firm*—Thomas A. Briody; Robert T. Mayer; Steven R. Biren

[57] ABSTRACT

A method of manufacturing a semiconductor device having at least one insulated gate field effect transistor in which a silicon body is provided with a silicon dioxide gate insulation layer and in which a boron-doped polysilicon electrode layer is formed on said layer, characterized in that the electrode layer is deposited by means of a low-pressure process, that the boron doping of the electrode layer is obtained by ion implantation, and that the silicon body is then subjected to a thermal treatment in an atmosphere containing hydrogen in which boron is diffused from the electrode layer through the gate insulation layer into a channel region underlying the electrode layer.

4 Claims, 1 Drawing Figure

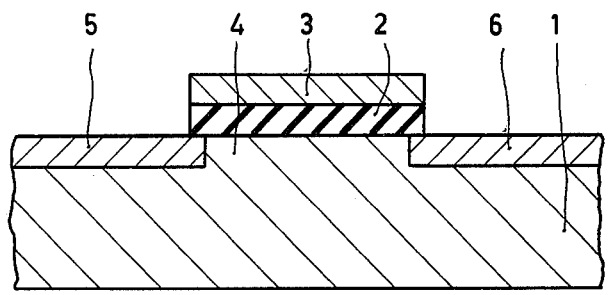

METHOD OF MANUFACTURING A SEMICONDUCTOR DEVICE

This is a continuation of application Ser. No. 943,234 filed Sept. 18, 1978 now abandoned.

BACKGROUND OF THE INVENTION

The invention relates to a method of manufacturing a semiconductor device having at least one insulated gate field effect transistor, in which a silicon body is provided with a silicon dioxide gate insulation layer and in which a boron-doped polysilicon electrode layer is formed on said layer.

By means of a method of the kind mentioned a p-channel field effect transistor of the enhancement type can be manufactured. During said manufacture it has been found that, when a thermal treatment is carried out in an atmosphere containing hydrogen after the said process steps, the threshold voltage decreases or a field effect transistor of the depletion type instead of the desired enhancement type can be obtained.

These experiences have led to the recognition that, when field effect transistors are to be manufactured having boron-doped polysilicon electrode layers, the atmosphere may not contain hydrogen (see, for example, "J. Electrochem. Soc. S.S.S. and T.", vol. 120, pp. 146-148 (1973)).

In addition, however, there has been a growing need for methods in which the threshold voltage of a field effect transistor can be adjusted accurately, which adjustment can be achieved only in a complicated manner in the methods known so far.

SUMMARY OF THE INVENTION

One of the objects of the invention is to improve the known methods to a considerable extent. The invention is based inter alia on the recognition that an improvement can be found in a more accurate definition of the process conditions in which the manufacture is carried out.

Therefore the method mentioned above is characterized according to the invention in that the electrode layer is deposited by means of a low-pressure process, that the boron doping of the electrode layer is obtained by ion implantation, and that the silicon body is then subjected to a thermal treatment in an atmosphere containing hydrogen in which boron is diffused from the electrode layer through the gate insulation layer into a channel region underlying the electrode layer.

Deposition by means of a low-pressure process is to be understood to mean herein that the process is carried out at a pressure lower than normal (atmospheric) pressure, namely in the pressure range between $10^{-4}$ and 1 atmosphere, in which phenomena, in the case of deposition of polysilicon chemical phenomena, occurring at the surface of the body to be covered determine the speed and the supply of thermal energy for the process takes place in a usual manner via said body.

It is known that in the presence of hydrogen the diffusion of boron through silicon oxide increases by a few orders of magnitude. In the method according to the invention the boron source, namely the boron-doped electrode layer, has a uniform thickness and a reproducible boron concentration. As a result of this, essential conditions have been obtained which, together with other parameters of the thermal treatment, for example, the treatment time, the treatment temperature and the hydrogen concentration, permit accurate control of the boron concentration in the channel region and of the threshold voltage.

When positive charges are present in silicon oxide layers they will tend to deplete the channel region in a p-type silicon body or even to invert it into the n-type. The channel region in an n-type silicon body may also be enhanced.

The method according to the invention may be used to decrease the pinch-off voltage of an n-channel field effect transistor of the depletion type or to obtain an n-channel field effect transistor of the enhancement type having a desired threshold voltage.

The method according to the invention is preferably used to obtain a p-channel field effect transistor and to reduce the threshold voltage in enhancement type devices. The method may alternatively be used to obtain a desired pinch-off voltage in a p-channel field effect transistor of the depletion type.

Comparatively few process steps are necessary when, preferably in the manufacture of a p-channel field effect transistor, the boron doping in the electrode layer takes place simultaneously with a boron implantation to obtain source and drain zones of the field effect transistor.

The process can also be carried out comparatively rapidly when the thermal treatment in the hydrogen atmosphere preferably overlaps in time at least partly a step to indiffuse boron ions implanted in the source and drain zones.

The invention also relates to a semiconductor device manufactured by means of the method according to the invention.

The invention will now be described in greater detail with reference to an embodiment and the accompanying drawing.

BRIEF DESCRIPTION OF THE DRAWING

The drawing is a diagrammatic sectional view of a part of a semiconductor device in a stage of its manufacture while using the method according to the invention.

DETAILED DESCRIPTION

The example relates to the manufacture of a semiconductor device having at least one insulated gate field effect transistor in which a silicon body 1 is provided with a gate insulation layer 2 consisting of silicon dioxide.

A boron-doped polysilicon electrode layer 3 is formed on the layer 2. The techniques for forming a polysilicon electrode layer on a gate oxide layer are well known in the art. See, for example, U.S. Pat. No. 4,080,719.

According to the invention the electrode layer 3 is deposited by means of a low-pressure process and the boron doping is obtained by ion implantation. The silicon body 1 is then subjected to a thermal treatment in an atmosphere containing hydrogen, in which boron is diffused from the electrode layer 3 through the gate insulation layer 2 into a channel region 4 underlying the electrode layer 3.

A p-channel field effect transistor of the enhancement type is manufactured, for example, as follows. Starting material is a an n-type silicon body 1 having a resistivity of 5 ohm.cm.

A 1000 A thick gate insulation layer 2 is formed on the body in the usual manner by thermal oxidation.

A 0.5 $\mu$m thick electrode layer 3 is deposited on the layer 2. In a gas atmosphere containing silane (SiH$_4$), the layer 3 is formed at a pressure of 0.2 atmosphere and a temperature of 650° C. in approximately 40 minutes. The layer 3 thus obtained has a thickness accuracy and reproducibility of 2-3%. A boron implantation is carried out in the usual manner by ion bombardment at 60 KeV for 20 minutes, a concentration in the layer 3 of $5.10^{19}$ boron atoms/cm$^3$ being obtained.

The resulting concentration is readily reproducible because the thickness and the quantity of implanted ions can be maintained accurately.

The doping of the electrode layer 3 may be carried out simultaneously with a boron implantation to obtain source and drain zones 5 and 6, respectively, of the field effect transistor. The thermal treatment in the hydrogen atmosphere takes place at 1050° C. for 5 to 20 minutes. At this temperature and in the above-mentioned conditions the threshold voltage decreases by 20 mV per minute. The last-mentioned rate increases when the thickness of the gate insulation layer 2 decreases. With comparatively large treatment times, the rate also depends on the treatment time. In the example described the threshold voltage decreases from 700 mV by 200 mV in 10 minutes.

The thermal treatment with hydrogen may overlap in time at least partly a step lasting, for example, 50 minutes, to indiffuse boron ions implanted in the source and drain zones 5 and 6. For example, hydrogen is admitted to the diffusion furnace in the last part of the diffusion step.

The invention is not restricted to the example described. For example, several field effect transistors having different characteristics can be formed in silicon bodies, namely with p-channels and with n-channels.

What is claimed is:

1. A method of manufacturing a boron-doped polysilicon gate semiconductor device having a silicon body and at least one insulated gate field effect transistor having a source region, of drain region and a channel region in the body, which comprises:
    forming a silicon dioxide gate insulation layer on said silicon body;
    depositing a polysilicon gate electrode layer on said silicon dioxide gate insulation layer and over said channel region in a low-pressure process;
    forming a boron source of substantially uniform thickness and reproducible boron concentration in the polysilicon gate electrode layer by boron doping the electrode layer by ion implantation; and
    then accurately controlling the threshold voltage of the device by subjecting the device to a thermal treatment in an atmosphere containing hydrogen to indiffuse the boron from the electrode layer, through the gate insulation layer and into the channel region of the field effect transistor underlying the electrode layer.

2. A method as claimed in claim 1, characterized in that a p-channel field effect transistor of the enhancement type is manufactured.

3. A method as claimed in claim 2, characterized in that the boron doping of the electrode layer is carried out simultaneously with a boron implantation to obtain said source and drain zones of the field effect transistor.

4. A method as claimed in claim 3, further comprising a step to indiffuse boron ions implanted in the source and drain zones, said thermal treatment in an atmosphere containing hydrogen being at least partly concurrent with said step to indiffuse boron ions.

* * * * *